(12) United States Patent  
Rogers

(10) Patent No.: US 10,685,862 B2  
(45) Date of Patent: Jun. 16, 2020

(54) CONTROLLING THE RF AMPLITUDE OF AN EDGE RING OF A CAPACITIVELY COUPLED PLASMA PROCESS DEVICE

(71) Applicant: Applied Materials, Inc., Santa Clara, CA (US)

(72) Inventor: James Rogers, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 630 days.

(21) Appl. No.: 15/394,070

(22) Filed: Dec. 29, 2016

(65) Prior Publication Data

US 2017/0213753 A1     Jul. 27, 2017

Related U.S. Application Data

(60) Provisional application No. 62/301,316, filed on Feb. 29, 2016, provisional application No. 62/286,028, filed on Jan. 22, 2016.

(51) Int. Cl.
*H01L 21/683* (2006.01)
*H01L 21/67* (2006.01)
(Continued)

(52) U.S. Cl.
CPC ........ *H01L 21/6833* (2013.01); *H01J 37/321* (2013.01); *H01J 37/3288* (2013.01);
(Continued)

(58) Field of Classification Search
CPC .......... H01L 21/6833; H01L 21/68735; H01L 21/67103; H01L 21/68785; H01L 21/6831;
(Continued)

(56) References Cited

U.S. PATENT DOCUMENTS 5,748,434 A * 5/1998 Rossman ............ H01L 21/6831
361/234
6,039,836 A   3/2000 Dhindsa et al.
(Continued)

FOREIGN PATENT DOCUMENTS

CN    1682344 A    10/2005
CN    1851896 A    10/2006
(Continued)

OTHER PUBLICATIONS

Office Action and Search Report for TW Application No. 106102018 dated Aug. 30, 2019.
(Continued)

*Primary Examiner* — Renan Luque  
(74) *Attorney, Agent, or Firm* — Patterson + Sheridan, LLP

(57) ABSTRACT

The present disclosure generally relates to apparatuses and methods that control RF amplitude of an edge ring. The apparatuses and methods include an electrode that is coupled to ground through a variable capacitor. The electrode may be ring-shaped and embedded in a substrate support including an electrostatic chuck. The electrode may be positioned beneath the perimeter of a substrate and/or the edge ring. As the plasma sheath drops adjacent the edge ring due to edge ring erosion, the capacitance of the variable capacitor is adjusted in order to affect the RF amplitude near the edge of the substrate. Adjustment of the RF amplitude via the electrode and variable capacitor results in adjustment of the plasma sheath near the substrate perimeter.

20 Claims, 6 Drawing Sheets

(51) Int. Cl.
  *H01J 37/32* (2006.01)
  *H01L 21/687* (2006.01)
(52) U.S. Cl.
  CPC .. *H01J 37/32091* (2013.01); *H01J 37/32146* (2013.01); *H01J 37/32541* (2013.01); *H01J 37/32568* (2013.01); *H01J 37/32577* (2013.01); *H01J 37/32605* (2013.01); *H01J 37/32697* (2013.01); *H01J 37/32715* (2013.01); *H01L 21/67017* (2013.01); *H01L 21/6719* (2013.01); *H01L 21/67103* (2013.01); *H01L 21/6831* (2013.01); *H01L 21/68735* (2013.01); *H01L 21/68785* (2013.01); *H01J 2237/332* (2013.01); *H01J 2237/334* (2013.01)
(58) Field of Classification Search
  CPC ............ H01L 21/6719; H01L 21/67017; H01J 37/32715; H01J 37/32697; H01J 37/32146; H01J 37/321; H01J 37/32091; H01J 2237/334; H01J 2237/332; H01J 37/32605; H01J 37/32577; H01J 37/32568; H01J 37/32541; H01J 37/3288; H01J 37/32532; H01J 37/32477; H01J 37/32431
  See application file for complete search history.

(56) References Cited

U.S. PATENT DOCUMENTS

| | | | |
|---|---|---|---|
| 6,232,236 | B1 | 5/2001 | Shan et al. |
| 7,758,764 | B2 | 7/2010 | Dhindsa et al. |
| 8,211,324 | B2 | 7/2012 | Dhindsa et al. |
| 8,734,664 | B2 * | 5/2014 | Yang ................. H01J 37/32082 216/67 |
| 8,988,848 | B2 | 3/2015 | Todorow et al. |
| 9,583,357 | B1 | 2/2017 | Long et al. |
| 9,601,319 | B1 | 3/2017 | Bravo et al. |
| 9,620,376 | B2 | 4/2017 | Kamp et al. |
| 9,761,459 | B2 | 9/2017 | Long et al. |
| 9,852,889 | B1 | 12/2017 | Kellogg et al. |
| 9,881,820 | B2 | 1/2018 | Wong et al. |
| 2001/0019881 | A1 * | 9/2001 | Ohmoto ................. H01J 37/321 438/584 |
| 2005/0056622 | A1 * | 3/2005 | Steger ............... H01J 37/32623 219/121.41 |
| 2009/0071938 | A1 * | 3/2009 | Dhindsa ............ H01J 37/32091 216/67 |
| 2009/0223810 | A1 | 9/2009 | Dhindsa et al. |
| 2010/0018648 | A1 | 1/2010 | Collins et al. |
| 2010/0326957 | A1 * | 12/2010 | Maeda ................... H01J 37/20 216/67 |
| 2011/0011535 | A1 | 1/2011 | Dhindsa et al. |
| 2012/0281334 | A1 * | 11/2012 | Sasaki ................. H01L 21/6831 361/234 |
| 2013/0107415 | A1 | 5/2013 | Banna et al. |
| 2013/0154175 | A1 * | 6/2013 | Todorow ............ H01L 21/6833 269/315 |
| 2013/0200494 | A1 * | 8/2013 | Chen ................ H01J 37/32623 257/595 |
| 2013/0203258 | A1 * | 8/2013 | Chen ................ H01J 37/32495 438/710 |
| 2013/0288483 | A1 * | 10/2013 | Sadjadi ............ H01L 21/02104 438/710 |
| 2014/0034239 | A1 | 2/2014 | Yang et al. |
| 2014/0069584 | A1 | 3/2014 | Yang et al. |
| 2015/0043122 | A1 * | 2/2015 | Eto ..................... B32B 37/1284 361/234 |
| 2016/0198528 | A1 * | 7/2016 | Kitagawa ............... H05B 3/283 156/345.52 |
| 2017/0018411 | A1 * | 1/2017 | Sriraman .......... H01J 37/32697 |
| 2017/0069462 | A1 | 3/2017 | Kanarik et al. |
| 2017/0110335 | A1 | 4/2017 | Yang et al. |
| 2017/0113355 | A1 | 4/2017 | Genetti et al. |
| 2017/0115657 | A1 | 4/2017 | Trussell et al. |
| 2017/0117172 | A1 | 4/2017 | Genetti et al. |
| 2017/0178917 | A1 | 6/2017 | Kamp et al. |
| 2017/0236688 | A1 | 8/2017 | Caron et al. |
| 2017/0236741 | A1 | 8/2017 | Angelov et al. |
| 2017/0236743 | A1 | 8/2017 | Severson et al. |
| 2017/0250056 | A1 | 8/2017 | Boswell et al. |
| 2017/0263478 | A1 | 9/2017 | McChesney et al. |
| 2017/0316935 | A1 | 11/2017 | Tan et al. |
| 2017/0330734 | A1 * | 11/2017 | Lee ................... H01J 37/32724 |
| 2017/0330786 | A1 | 11/2017 | Genetti et al. |
| 2017/0334074 | A1 | 11/2017 | Genetti et al. |
| 2017/0372912 | A1 | 12/2017 | Long et al. |

FOREIGN PATENT DOCUMENTS

| | | |
|---|---|---|
| CN | 103177927 A | 6/2013 |
| CN | 104465291 A | 3/2015 |
| CN | 206758401 U | 12/2017 |
| TW | 201005825 A | 2/2010 |
| TW | 201535588 A | 9/2015 |

OTHER PUBLICATIONS

First Office Action and Search Report for CN Application No. 201710048220.5 dated Jul. 29, 2019.

* cited by examiner

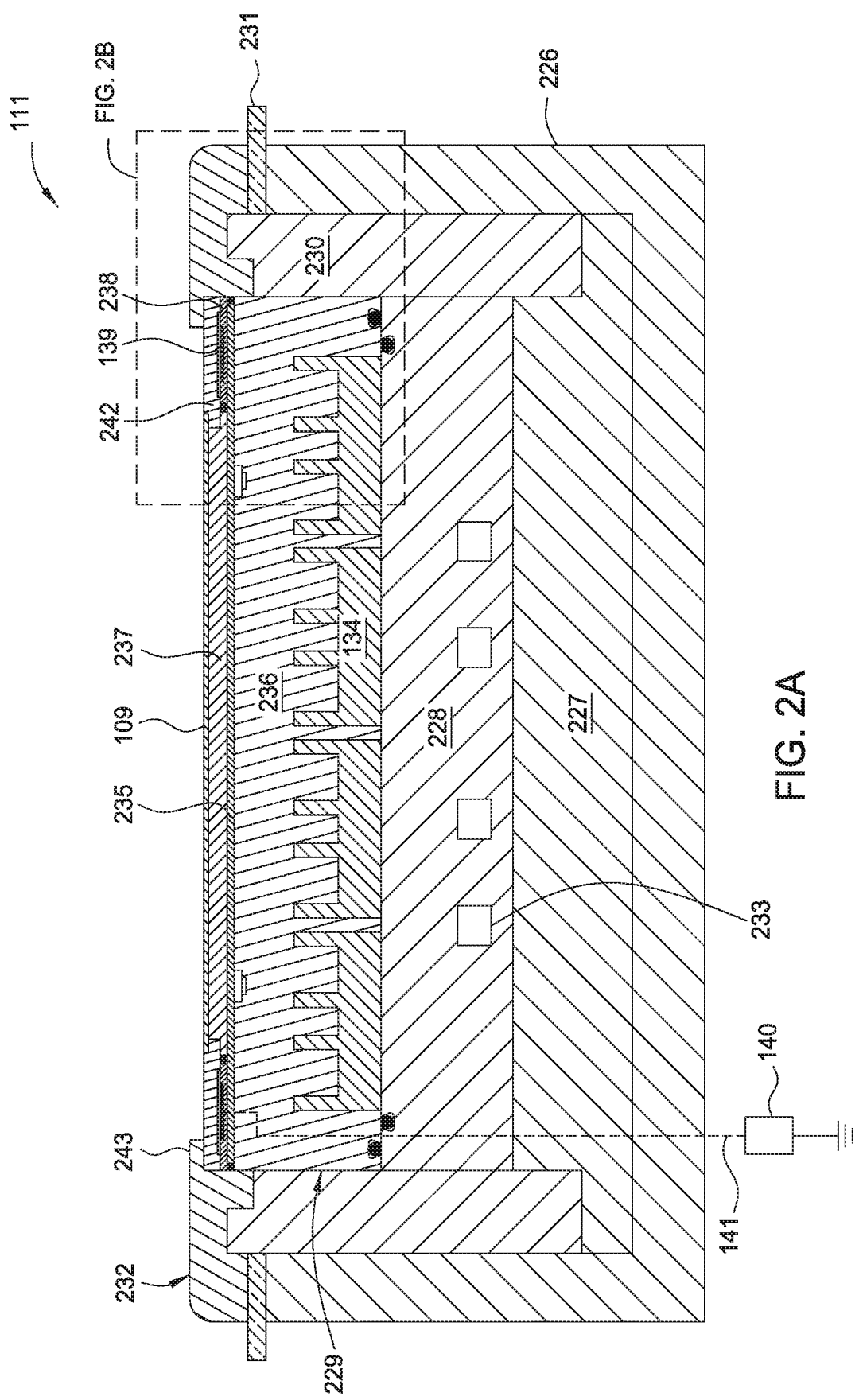

CONTROLLING THE RF AMPLITUDE OF AN EDGE RING OF A CAPACITIVELY COUPLED PLASMA PROCESS DEVICE

CROSS-REFERENCE TO RELATED APPLICATIONS

This application claims benefit of U.S. Provisional Patent Application Ser. No. 62/301,316, filed Feb. 29, 2016, and United States Provisional Patent Application Ser. No. 62/286,028, filed Jan. 22, 2016, which are herein incorporated by reference.

BACKGROUND

Field

Aspects of the present disclosure generally relate to apparatuses and methods for controlling the RF amplitude of an edge ring in a processing chamber.

Description of the Related Art

An edge ring is a circular component which surrounds a perimeter of a substrate, such as a semiconductor wafer, during processing in process chamber. Due to exposure of the edge ring to plasma within the process chamber, the edge ring may erode and require replacement or other preventative maintenance after a predetermined interval. When the edge ring is eroded too much, the plasma sheath at the edge of the substrate drops lower and changes the plasma processing characteristics at the edge of the substrate. The change in plasma processing characteristics causes undesirable processing effects at the edge of the substrate, thus reducing the usable real estate near the edge of the substrate.

Therefore, there is a need for apparatuses and methods that address edge ring erosion.

SUMMARY

In one aspect, a substrate support comprises an electrostatic chuck having one or more chucking electrodes embedded therein for chucking a substrate to the electrostatic chuck; a ceramic layer disposed over the electrostatic chuck; a ceramic ring positioned around the ceramic layer; an electrode embedded in the ceramic ring; and a variable capacitor coupled to the electrode through one or more transmission lines.

In another aspect, a process chamber comprises a chamber body; a lid disposed on the chamber body; an inductively coupled plasma apparatus positioned above the lid; and a substrate support positioned within the chamber body, the substrate support comprising: an electrostatic chuck having one or more chucking electrodes embedded therein for chucking a substrate to the electrostatic chuck; a ceramic layer disposed over the electrostatic chuck; a ceramic ring positioned around the ceramic layer; an electrode embedded in the ceramic ring, the electrode coupled to a variable capacitor through one or more transmission lines.

In another aspect, a method of processing substrate comprises processing a predetermined amount of substrates using a plasma sheath, resulting in erosion of an edge ring; increasing RF voltage at the edge ring after the erosion to reposition the plasma sheath; and processing additional substrates after the increasing the RF voltage to alter the erosion of the edge ring.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope, and the disclosure may admit to other equally effective aspects.

FIGS. 2A and 2B illustrate enlarged schematic views of the substrate support shown in FIG. 1.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

The present disclosure generally relates to apparatuses and methods that control RF amplitude of an edge ring. The apparatuses and methods include an electrode that is coupled to ground through a variable capacitor. The electrode may be ring-shaped and embedded in a substrate support including an electrostatic chuck. The electrode may be positioned beneath the perimeter of a substrate and/or the edge ring. As the plasma sheath drops adjacent the edge ring due to edge ring erosion, the capacitance of the variable capacitor is adjusted in order to affect the RF amplitude near the edge of the substrate. Adjustment of the RF amplitude via the electrode and variable capacitor results in adjustment of the plasma sheath near the substrate perimeter.

Figure 1:
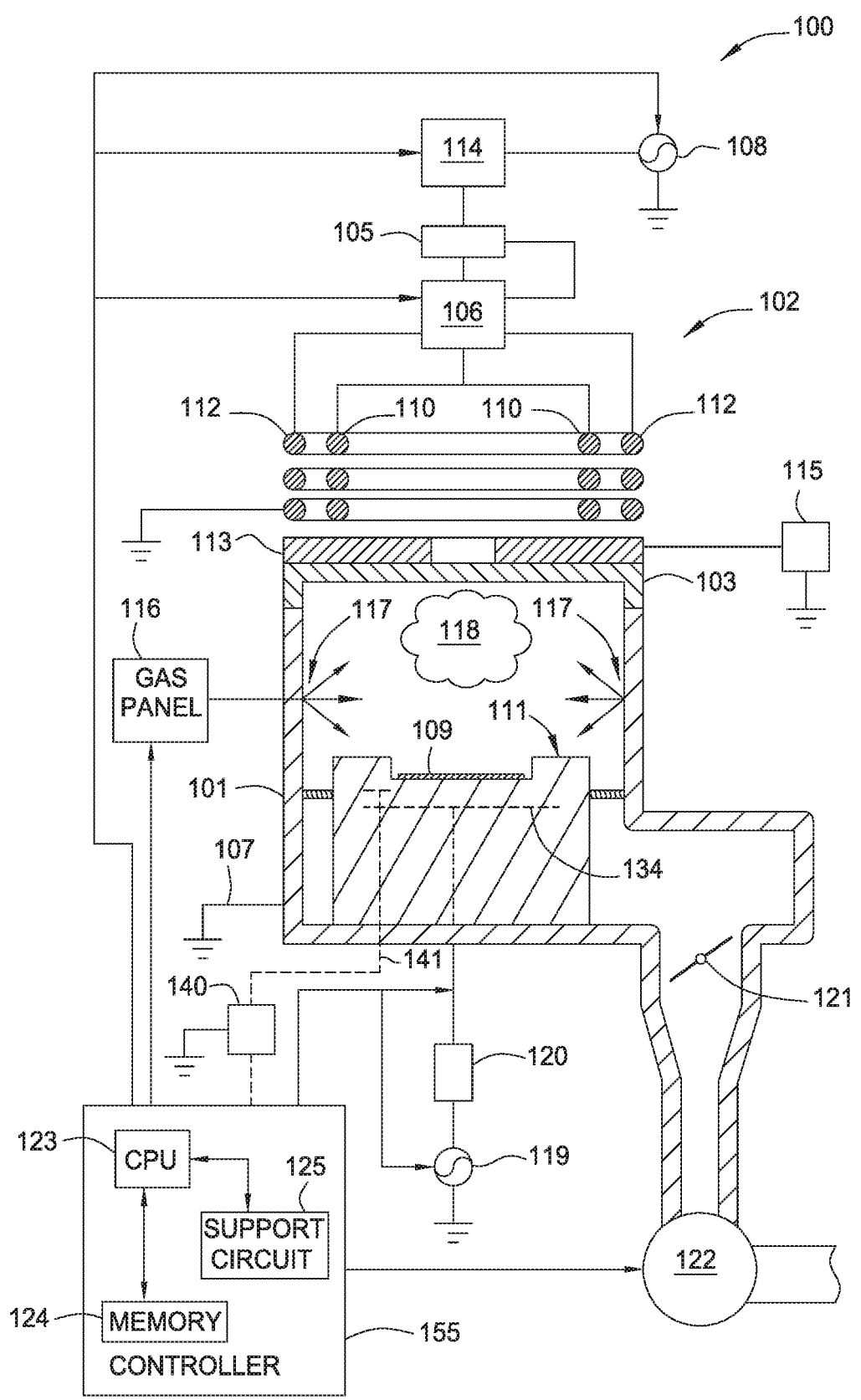
FIG. 1 is a schematic sectional view of a process chamber, according to one aspect of the disclosure.

FIG. 1 is a schematic sectional view of a process chamber 100, according to one aspect of the disclosure. The process chamber 100 includes a chamber body 101 and a lid 103 disposed thereon that together define an inner volume. The chamber body 101 is typically coupled to an electrical ground 107. A substrate support 111 is disposed within the inner volume to support a substrate 109 thereon. The process chamber 100 also includes an inductively coupled plasma apparatus 102 for generating a plasma region 118 within the process chamber 100, and a controller 155 adapted to control aspects of the process chamber 100.

The substrate support 111 includes one or more electrodes 134 coupled to a bias source 119 through a matching network 120, and a circular electrode 139 coupled to ground through a variable capacitor 140. The inductively coupled plasma apparatus 102 is typically disposed above the lid 103 and is configured to inductively couple RF power into the process chamber 100. The inductively coupled plasma apparatus 102 includes first and second coils 110, 112, disposed above the lid 103. The relative position, ratio of diameters of each coil, 110, 112 and/or the number of turns in each coil 110, 112 can each be adjusted to control, for example, the profile or density of the plasma region 118. Each of the first and second coils 110, 112 is coupled through a matching network 114 via the RF feed structure 106, to an RF power supply 108. The RF power supply 108 may be capable, in one example, of producing up to about 4000 Watts at a tunable frequency in a range from 50 kHz to 13.56 MHz.

However, other frequencies and powers may be provided as desired for particular applications.

In some aspects, a power divider 105, such as a dividing capacitor, may be provided between the RF feed structure 106 and the RF power supply 108 to control the relative quantity of RF power provided to the respective first and second coils 110, 112. In some aspects, the power divider 105 may be incorporated into the matching network 114.

A heater element 113 may be disposed atop the lid 103 to facilitate heating the interior of the process chamber 100. The heater element 113 may be disposed between the lid 103 and the first and second coils 110, 112. In some aspects, the heater element 113 may include a resistive heating element and may be coupled to a power supply 115, such as an AC power supply, configured to provide sufficient energy to control the temperature of the heater element 113 within a desired range.

During operation, the substrate 109 (such as a semiconductor wafer or other substrate suitable for plasma processing) may be placed on the substrate support 111 and process gases may be supplied from a gas panel 116 through entry ports 117. The process gases may be ignited into a plasma region 118 in the process chamber 100 by applying power from the RF power supply 108 to the first and second coils 110, 112. In some aspects, power from a bias source 119, such as an RF or shaped pulse source, may also be provided through a matching network 120 to electrodes 134 within the substrate support 111. The pressure within the interior of the process chamber 100 may be controlled using a valve 121 and a vacuum pump 122. The temperature of the chamber body 101 may be controlled using fluid-containing conduits (not shown) that run through the chamber body 101.

The process chamber 100 includes a controller 155 to control aspects of the process chamber 100 during processing. The controller 155 comprises a central processing unit (CPU) 123, a memory 124, and support circuits 125 for the CPU 123. The controller 155 facilitates control of the components of the process chamber 100. The controller 155 may be one of any form of general-purpose computer that can be used in an industrial setting for controlling various chambers and sub-processors. The memory 124 stores software (source or object code) that may be executed or invoked to control the operation of the process chamber 100 in manners described herein.

Figure 2B:
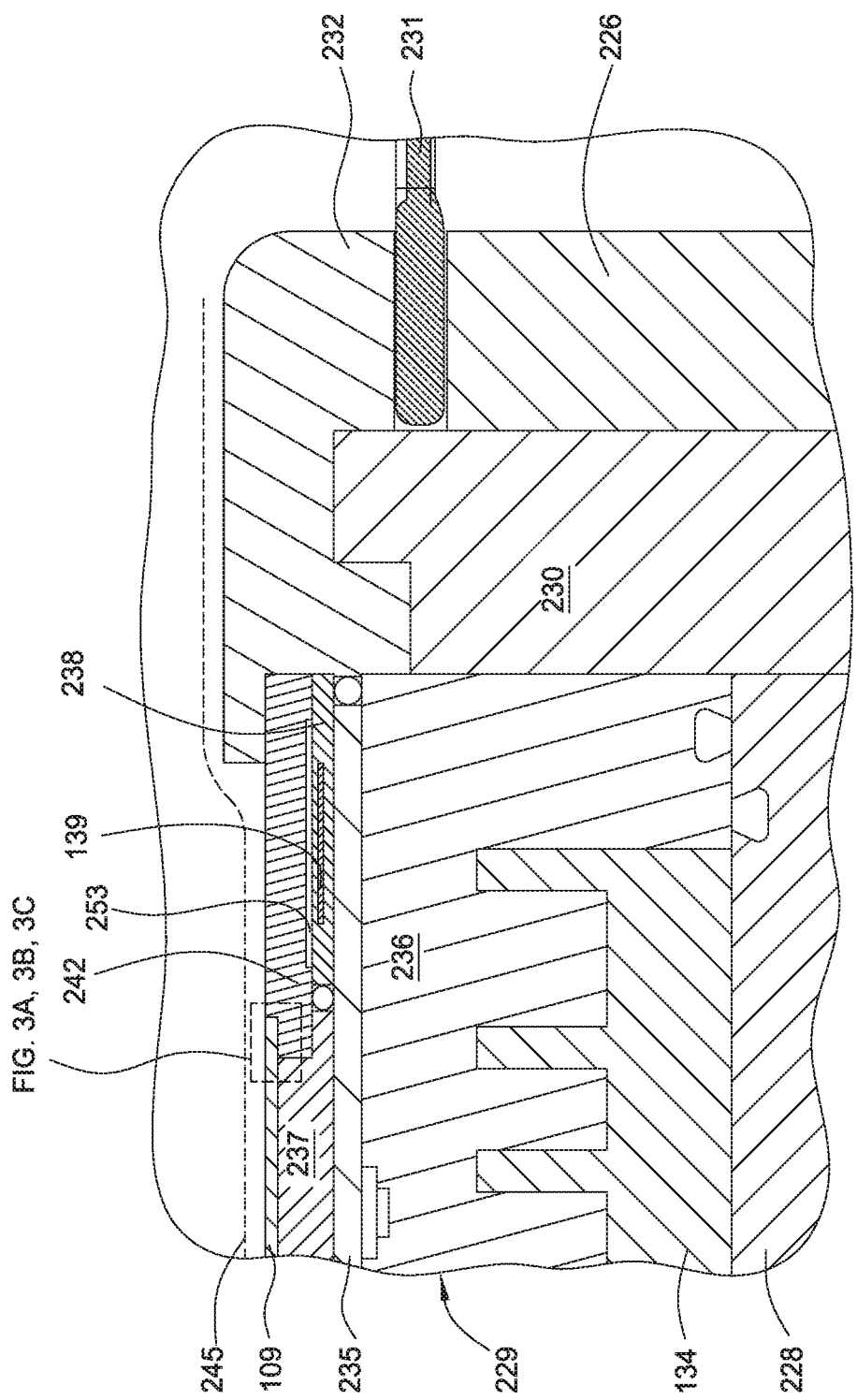

FIGS. 2A and 2B illustrate enlarged schematic views of the substrate support 111 shown in FIG. 1. The substrate support 111 includes a ground plate 226 surrounding an insulating layer 227, a facilities plate 228, and an electrostatic chuck 229 assembled in a vertical stack. A quartz pipe ring 230 circumscribes the facilities plate 228 and the electrostatic chuck 229 to insulate the RF-hot electrostatic chuck 229 from the ground plate 226. A plasma shield 231 is disposed on an upper surface of the quartz pipe ring 230 to facilitate plasma containment in the process chamber 100 (shown in FIG. 1). A quartz ring 232 is positioned on an upper surface of the plasma shield 231 and includes a lower recess for engaging the quartz pipe ring 230.

The facilities plate 228 is positioned between a lower portion of the ground plate 226 and the electrostatic chuck 229. The facilities plate 228 includes a one or more channels 233 (four are shown) through which a fluid is provided to facilitate temperature control of the substrate support 111. The electrostatic chuck 229 includes a plurality of electrodes 134 (four are shown) embedded in an insulating material 236. The electrodes 134 are coupled to the bias source 119 (shown in FIG. 1) to facilitate chucking of a substrate 109 to an upper surface of the electrostatic chuck 229. In some aspects, the electrodes 134 are cathodes coupled through a matching network 120 to the bias source 119. The bias source 119 may illustratively be a source of up to about 1000 W (but not limited to about 1000 W) of RF energy at a frequency of, for example, approximately 13.56 MHz, although other frequencies and powers may be provided as desired for particular applications. The bias source 119 may be capable of producing either or both of continuous or pulsed power. In some aspects, the bias source 119 may be a DC or pulsed DC source. In some aspects, the bias source 119 may be capable of providing multiple frequencies, such as 13.56 MHz and 2 MHz.

A heater 235 is disposed on an upper surface of the electrostatic chuck 229 to facilitate temperature control of the substrate 109. The heater 235 may be, for example, a resistive heater having a plurality of resistive heating elements embedded therein. A ceramic layer 237, such as silicon carbide or alumina, is disposed over the upper surface of the heater 235 and provides a protective interface between the heater 235 and the substrate 109. A ceramic ring 238 surrounds and abuts the radially-outward edges of the ceramic layer 237. The ceramic ring 238 may be made of, for example, silicon dioxide or silicon nitride, and may have a thickness within a range of about 1 millimeter to about 2 millimeters. A circular electrode 139 is embedded in the ceramic ring 238. The circular electrode 139 may be positioned about 0.5 millimeters to about 1 millimeter from the upper surface of the ceramic ring 238, such as about 0.75 millimeters. The circular electrode 139 may have a width of about 3 millimeters to about 20 millimeters, such as about 6 millimeters.

The circular electrode 139 is positioned radially outward of the perimeter of the substrate 109 and beneath an edge ring 242. In one example, the circular electrode 139 may have an inner diameter greater than 200 millimeters, or greater than 300 millimeters, or greater than 400 millimeters. The circular electrode 139 is electrically coupled to ground through a variable capacitor 140. The circular electrode 139 may be coupled to the variable capacitor 140 through multiple transmission lines 141 (one is shown). For example, the circular electrode 139 may be coupled to the variable capacitor 140 through three transmission lines 141 spaced about the circular electrode 139 at even intervals (i.e., 120 degrees). In one example, the utilization of multiple transmission lines 141 may reduce the occurrence of RF or temperature non-uniformities by making any asymmetries of the transmission lines higher order and lower amplitude.

The edge ring 242 is positioned over the ceramic ring 238 and in contact with the ceramic ring 238 and the ceramic layer 237. In one example, the edge ring 242 may be formed from silicon carbide, graphite coated with silicon carbide, or low resistivity doped silicon. An upper surface of the edge ring 242 contacts a lower surface of an overhanging ledge of the quartz ring 232. The edge ring 242 circumscribes the substrate 109 and reduces undesired etching or deposition of material at the radially-outward edges of the substrate 109. In one example, the substrate 109 is spaced radially from the edge ring 242 to facilitate sealing of the substrate 109 to the electrostatic chuck 229.

Referring to FIG. 2B, during processing, a plasma sheath 245 may form over the surface of the substrate 109. As described above, processing conditions may erode the upper portion of the edge ring 242, causing undesired processing of the edge of the substrate 109, such as rollover. The undesired processing reduces device yield and affects substrate-to-substrate uniformity. To reduce these undesired effects, conventional approaches frequently replaced the edge ring 242. However, frequent replacement of the edge ring 242 is expensive from a consumable material point of view, and additionally, requires significant down time.

In contrast to conventional approaches, aspects described herein utilize a circular electrode 139 coupled to ground through a variable capacitor 140 to adjust the RF amplitude, and thus the plasma sheath, near the edge ring 242. Due to the relatively reduced thickness of the ceramic ring 238 in contrast to conventional approaches, RF power initially delivered to the electrostatic chuck 229 has a high RF coupling with the edge ring 242. In other words, the RF amplitude on the edge ring 242 could be higher than the RF amplitude on the substrate 109. Adjustment of the capacitance of the variable capacitor 140 is increased enough that the RF voltage at the edge ring 242 is comparable to the substrate 109. As the edge ring 242 is eroded, the RF capacitance can be decreased to increase the RF amplitude and therefore the sheath thickness to keep the top of the sheath in approximately the same location. The adjustment of the RF amplitude thereby facilitates continued utilization of the eroded edge ring while mitigating undesired processing effects on the substrate 109.

In one optional aspect, a gap 253 may be provided between an upper surface of the ceramic ring 238 and a lower surface of the edge ring 242. The gap 253 may be utilized to decrease coupling between the circular electrode 139 and the plasma sheath 245. The thickness of the gap 253 may be selected to provide a desired amount of decoupling. In another aspect, it is contemplated that the circular electrode 139 may have another shape, or may include a plurality of distinct electrodes which may be arranged into a desired shape or configuration.

In addition to the aspects described above, other aspects of the disclosure are also contemplated. In one example, the length of a transmission line 141 may have a length that is lambda (wavelength) divided by 2 (e.g., λ/2) to facilitate matched impedance, in at least one frequency. In another aspect, it is contemplated that the width of the electrode 139 may be selected to increase or decrease electrical coupling with the edge ring 242, as desired. In another aspect, it is contemplated that an optional gap 253 may be omitted. In another aspect, it is contemplated that a conductive thermal gasket, for example, a silicone-based thermal gasket, may occupy the gap 253. In another aspect, the variable capacitor 140 may be coupled to the RF power supply 108 rather than to ground. In such an aspect, the variable capacitor 140 would facilitate adjustment of capacitive coupling, rather than a parasitic effect as described above.

Figure 3A:
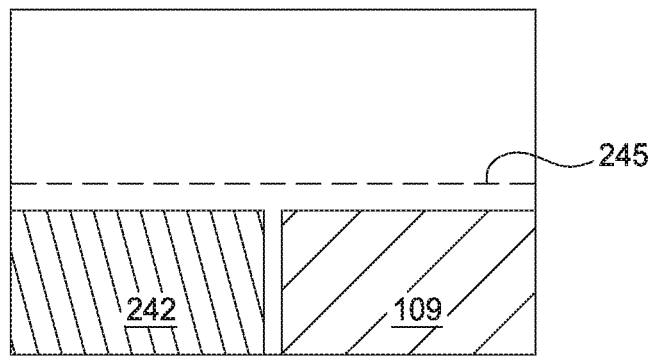
FIGS. 3A-3C are schematic views of a plasma sheath relative to the perimeter of a substrate, according to aspects of the disclosure.
Figure 3B:
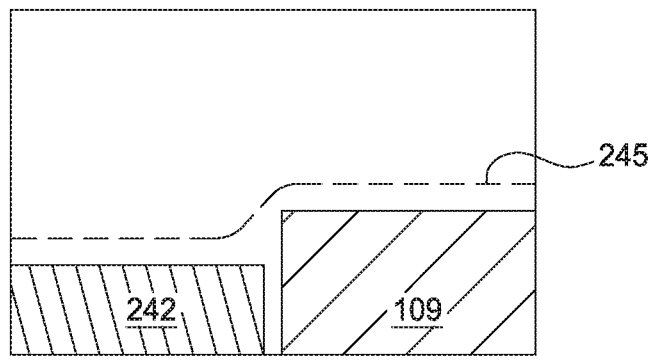
Figure 3C:
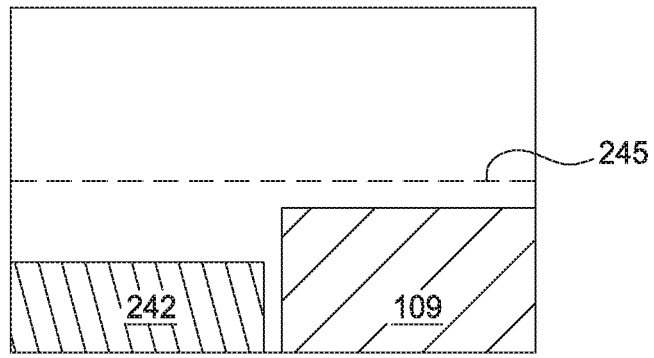

FIGS. 3A-3C are schematic views of a plasma sheath 245 relative to the perimeter of a substrate 109, according to aspects of the disclosure. FIG. 3A illustrates a plasma sheath 245 relative to an edge ring 242 and a substrate 109 prior to erosion of the edge ring 242. The plasma sheath 245 is a layer in a plasma which has a greater density of positive ions, and hence an overall excess positive charge, that balances an opposite negative charge on the surface of a material with which it is in contact. As illustrated in FIG. 3A, the upper surface of the edge ring 242 and the substrate 109 are generally coplanar prior to erosion of the edge ring 242. Prior to erosion of the edge ring 242, the plasma sheath 245 is parallel with and equally spaced from the upper surfaces of the edge ring 242 and the substrate 109. The profile of the plasma sheath 245 illustrated in FIG. 3A results in uniform processing of the substrate 109, particular near the radially-outward edge thereof.

After processing a predetermined number of substrates, conditions in the process chamber result in undesired erosion of the edge ring 242. FIG. 3B illustrates an eroded edge ring 242. In one example, the upper surface of the edge ring 242 may be eroded away, thereby reducing the thickness of the edge ring 242. The eroded edge ring 242 no longer shares a coplanar upper surface with a substrate 109. Due to the interaction between edge ring 242 and charged particles in a plasma, the profile of the plasma sheath 245 is changed in the presence of the eroded edge ring 242. As illustrated in FIG. 3B, the plasma sheath 245 drops at the interface of the substrate 109 and the edge ring 242 to maintain equidistant spacing from the surface of the edge ring 242 as compared to the substrate 109. The profile of the plasma sheath 245 may result in "rounding" or other undesired processing of the radially-outward edge of the substrate 109. The rounding of the substrate edge decreases the usable real estate of the substrate 109, thus decreasing device yield per substrate. This undesired rounding may commonly be referred to as a "rollover effect". In conventional systems, to correct this rounding, the eroded edge ring 242 would be replaced, thus causing processing down time while increasing the cost of consumable parts.

In contrast, aspects of the present disclosure utilize a circular electrode 139 to adjust the RF amplitude, and the thus the location of the plasma sheath 245, above the eroded edge ring 242. As the variable capacitor 140 (shown in FIG. 2A) is adjusted, the negative voltage to the circular electrode 139 is changed. The capacitance to ground acts like part of a capacitive voltage divider with fixed capacitance coupling power from the electrostatic chuck 229 to the edge ring 242, and a variable capacitance to ground. The variable capacitor 140 may be adjusted to short out more or less of the RF power to the edge ring 242, thereby changing the height of the plasma sheath 245 above the edge ring 242. Thus, the variable capacitor 140 and the circular electrode 139 facilitate compensation of the eroded edge ring 242.

Compensation of the eroded edge ring 242 via the variable capacitor 140 and the circular electrode 139 results in reestablishment of the original (e.g., planar) profile of the plasma sheath 245. FIG. 3C illustrates an adjusted plasma sheath 245 adjacent to an eroded edge ring 242. The adjusted plasma sheath 245 does not cause a "rollover effect" on the substrate 109, thus preventing damage to the substrate 109 and maximizing the usable real estate of the substrate 109. Moreover, because the eroded edge ring 242 may continue to be utilized in an eroded state, the time between preventative maintenances is extended, thereby decreasing processing downtime. Additionally, the eroded edge rings 237 require less frequent replacement, thereby decreasing expenses for consumable parts.

Figure 4A:
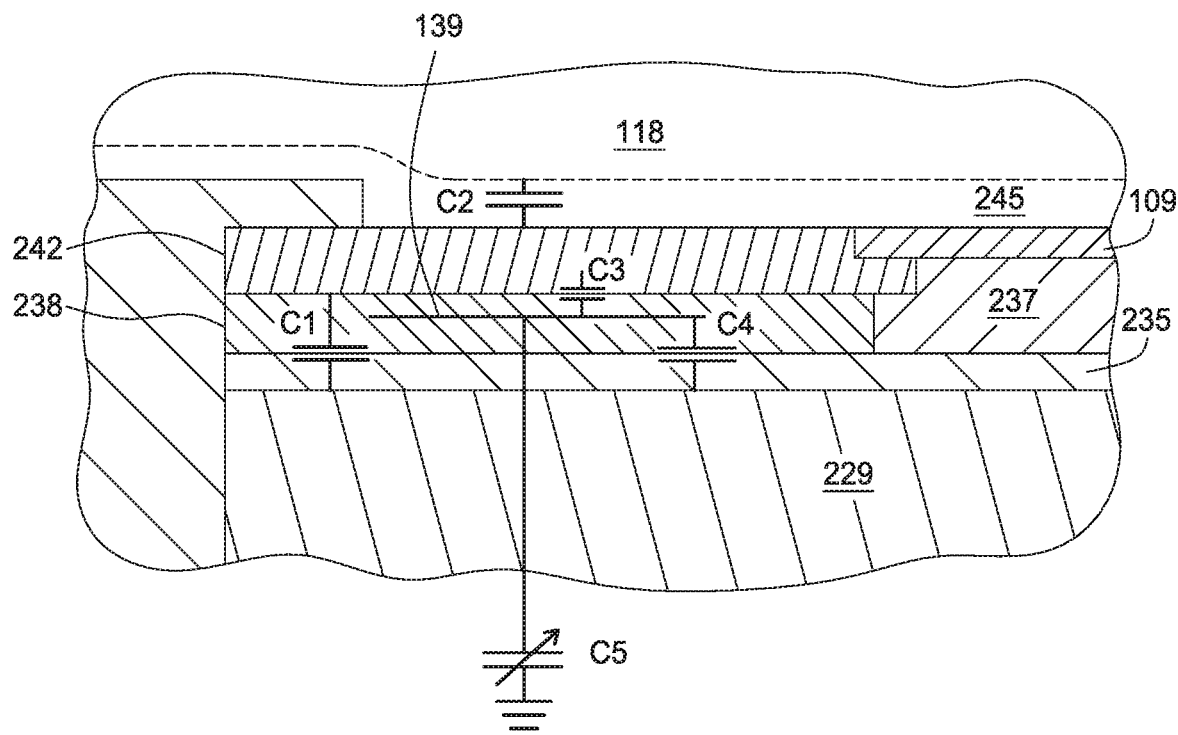
FIGS. 4A and 4B illustrate schematic circuit diagrams, according to one aspect of the disclosure.
Figure 4B:
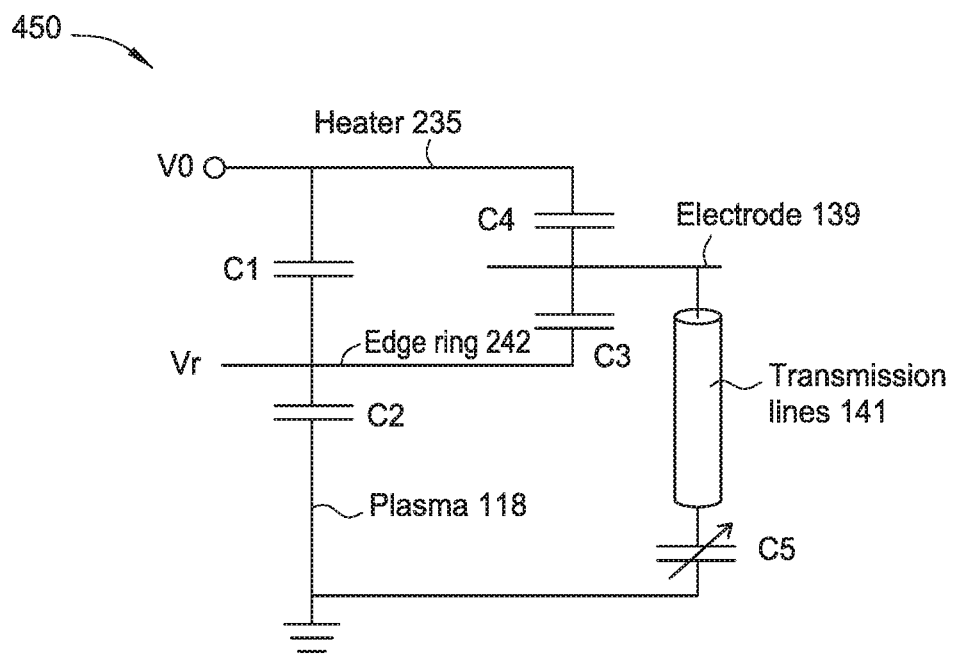

FIGS. 4A and 4B illustrate schematic circuit diagrams, according to one aspect of the disclosure. FIGS. 4A and 4B illustrate an element model 450 within the substrate support 111. To facilitate explanation, FIG. 4A illustrates the element model 450 overlaid on a partial view of the substrate support 111. The term element model is used to describe the functional relationships amongst components of a system, for example, when using a conductive silicon carbide layer having a resistivity less than 10 ohm-centimeter (Ω-cm).

In the element model 450, power is applied from V0, e.g., power at the electrostatic chuck 229 from the bias source 119. A capacitance C1 is present between the baseplate 229 and the edge ring 242 through the heater 235 and the ceramic ring 238. Additionally, a capacitance C4 is present between the baseplate 229 and the electrode 139 through the interface of the heater 235 and the ceramic ring 238. A capacitance C2 is present between the edge ring 242 and a plasma 118. The capacitance C2 is coupled to ground through the plasma 118. A capacitance C3 is present between the edge ring 242 and the electrode 139 through the ceramic 238. A variable capacitor 140 is coupled to ground as well as to the electrode 139 through one or more transmission lines 141. The variable capacitor 140 may be adjusted to control the RF voltage applied to the electrode 139, as described above. It is to be noted that the element model 450 is only one example of a circuit, and other circuits are also contemplated.

Figure 5:
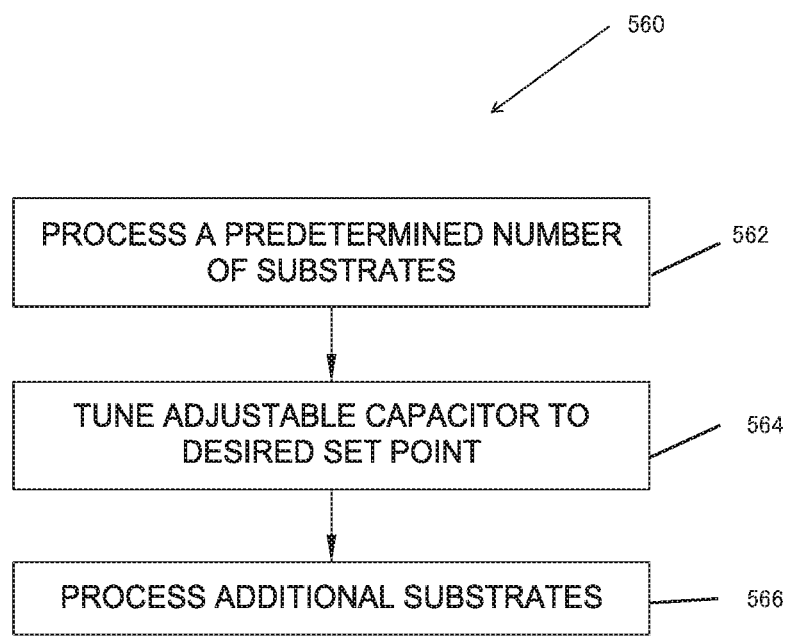
FIG. 5 is a flow diagram illustrating a method of processing substrates, according to one aspect of the disclosure.

FIG. 5 is a flow diagram illustrating a method 560 of processing substrates, according to one aspect of the disclosure. The method 560 begins in operation 562. In operation 562, a predetermined number of substrates are processed using a new or refurbished edge ring. The new or refurbished edge ring positions the plasma sheath in a known position, such as parallel to the upper surface of the edge ring and a substrate being processed. However, after processing the predetermined number of substrates, the edge ring erodes, and changes the position of the plasma sheath during processing. At this point, method 560 proceeds to operation 564, and the adjustable capacitor is tuned to correct for the deviation in the plasma sheath due to the erosion of the edge ring. Subsequently, in operation 566, additional substrates are processed while the plasma sheath is maintained in the corrected position by the adjustable capacitor and the electrode. Operations 564 and 566 may then be repeated until the edge ring is unusable or the tunable capacitor is unable to provide sufficient adjustment.

While FIG. 5 describes one aspect of a method 560, other aspects are also contemplated. For example, instead of adjusting the tunable capacitor after a predetermined number of substrates is processed, which may be empirically determined, the edge ring thickness or position of the plasma sheath may be monitored to indicate when operation 564 is to occur.

Benefits of the disclosure include the ability to adjust plasma sheaths in lieu of replacing chamber components, thereby improving device yield while mitigating downtime and reducing expenditures on consumables. Additionally, aspects described herein allow for the plasma sheath to be adjusted independent of a matching network, thereby greatly simplifying the adjustment of the plasma sheath and the hardware required to do so.

In some aspects, an electrode is formed in a ceramic layer disposed on or built into an electrostatic chuck. The electrode is coupled at one or more locations to high impedance transmission lines. The transmission lines are coupled to ground through a variable capacitor. The electrode functions as a center of a capacitive voltage divider, between the fixed capacitance of the electrostatic chuck and the electrode, and the variable capacitance to ground. The capacitance through the variable capacitor may be decreased as an edge ring is eroded, thus increasing the RF amplitude at the edge ring, at a desirable rate to compensate for the edge ring erosion. The increased RF voltage at the edge ring adjusts the location of the plasma sheath to correct for the erosion of the edge ring. In some aspects, to compensate for extreme edge plasma parameters, the RF voltage at the edge ring may be adjusted to be greater than or less than the RF voltage of the substrate, as desired.

While the foregoing is directed to aspects of the present disclosure, other and further aspects of the disclosure may be devised without departing from the basic scope thereof, and the scope thereof is determined by the claims that follow.

What is claimed is:

1. A substrate support, comprising:
   an electrostatic chuck having one or more chucking electrodes embedded therein for chucking a substrate to the electrostatic chuck;
   a ceramic layer disposed over the electrostatic chuck;
   a ceramic ring positioned around the ceramic layer;
   an edge ring in contact with the ceramic ring and the ceramic layer, wherein the edge ring comprises a recess formed in a lower surface thereof, the recess defining a gap between the edge ring and an upper surface of the ceramic ring;
   an electrode embedded in the ceramic ring; and
   a variable capacitor coupled to the electrode through one or more transmission lines.

2. The substrate support of claim 1, wherein the electrode embedded in the ceramic ring is ring-shaped.

3. The substrate support of claim 1, wherein the variable capacitor is electrically coupled to ground.

4. The substrate support of claim 1, further comprising a heater positioned between the electrostatic chuck and the ceramic layer.

5. The substrate support of claim 1, wherein the ceramic ring comprises silicon dioxide or silicon nitride.

6. The substrate support of claim 1, wherein the gap decreases coupling between the electrode and a plasma sheath.

7. The substrate support of claim 1, wherein the electrode embedded in the ceramic ring is vertically aligned with the gap.

8. A process chamber, comprising:
   a chamber body;
   a lid disposed on the chamber body;
   an inductively coupled plasma apparatus positioned above the lid; and
   a substrate support positioned within the chamber body, the substrate support comprising:
     an electrostatic chuck having one or more chucking electrodes embedded therein for chucking a substrate to the electrostatic chuck;
     a ceramic layer disposed over the electrostatic chuck;
     a ceramic ring positioned around the ceramic layer;
     an edge ring disposed on and in contact with the ceramic ring and the ceramic layer, wherein the edge ring comprises a recess formed in a lower surface thereof, the recess defining a gap between the edge ring and an upper surface of the ceramic ring; and
     an electrode embedded in the ceramic ring, the electrode coupled to a variable capacitor through one or more transmission lines.

9. The process chamber of claim 8, wherein the electrode embedded in the ceramic ring is ring-shaped.

10. The process chamber of claim 8, wherein the variable capacitor is electrically coupled to ground.

11. The process chamber of claim 8, further comprising a heater positioned between the electrostatic chuck and the ceramic layer.

12. The process chamber of claim 8, wherein the ceramic ring comprises silicon dioxide or silicon nitride.

13. The process chamber of claim 8, further comprising a bias source coupled to the one or more chucking electrodes, and an RF power supply coupled to the inductively coupled plasma apparatus.

14. The process chamber of claim 8, wherein the one or more transmission lines is three transmission lines.

15. The process chamber of claim 14, where the one or more transmission lines are coupled to the electrode embedded in the ceramic ring at equal intervals.

16. The process chamber of claim 8, wherein the electrode embedded in the ceramic ring has a width of approximately 3 millimeters to approximately 20 millimeters.

17. The substrate support of claim 8, wherein the gap decreases coupling between the electrode and a plasma sheath.

18. A substrate support, comprising:
   an electrostatic chuck having one or more chucking electrodes embedded therein;
   a ceramic layer disposed over the electrostatic chuck;
   a ceramic ring positioned around the ceramic layer;
   an edge ring in contact with the ceramic ring and the ceramic layer, wherein the edge ring comprises a recess formed in a lower surface thereof, the recess defining a gap between the edge ring and an upper surface of the ceramic ring;
   a thermal gasket disposed in the gap between the ceramic ring and the edge ring;
   an electrode embedded in the ceramic ring; and
   a variable capacitor coupled to the electrode through one or more transmission lines.

19. The substrate support of claim 18, wherein the thermal gasket comprises a conductive material.

20. The substrate support of claim 18, wherein the gap decreases coupling between the electrode and a plasma sheath, and wherein the electrode embedded in the ceramic ring is aligned with the gap.

* * * * *

UNITED STATES PATENT AND TRADEMARK OFFICE
CERTIFICATE OF CORRECTION

PATENT NO. : 10,685,862 B2
APPLICATION NO. : 15/394070
DATED : June 16, 2020
INVENTOR(S) : James Rogers It is certified that error appears in the above-identified patent and that said Letters Patent is hereby corrected as shown below:

In the Claims

In Column 9, Line 7, in Claim 17, delete "substrate support" and insert -- process chamber --, therefor.

Signed and Sealed this
Eleventh Day of August, 2020

Andrei Iancu
*Director of the United States Patent and Trademark Office*